United States Patent [19]

Collins et al.

[11] Patent Number: 5,068,859
[45] Date of Patent: Nov. 26, 1991

[54] LARGE CONTRAINT LENGTH HIGH SPEED VITERBI DECODER BASED ON A MODULAR HIERARCHICAL DECOMPOSITION OF THE DEBRUIJN GRAPH

[75] Inventors: Oliver Collins, Key West, Fla.; Samuel J. Dolinar, Jr., Tujunga, Calif.; In-Shek Hus, Pasadena, Calif.; Fabrizio P. Bozzola, North Hollywood, Calif.; Erlend M. Olson, Azusa, Calif.; Joseph I. Statman, N. Hollywood, Calif.; George A. Zimmerman, San Pedro, Calif.

[73] Assignee: California Institute of Technology, Pasadena, Calif.

[21] Appl. No.: 368,264

[22] Filed: Jun. 19, 1989

[51] Int. Cl.⁵ .............................................. G06F 11/10
[52] U.S. Cl. ................................................... 371/43
[58] Field of Search ....................... 371/43, 44, 45, 46; 375/17, 34, 39

[56] References Cited

U.S. PATENT DOCUMENTS

| | | | |
|---|---|---|---|
| 3,789,360 | 1/1974 | Clark, Jr. et al. | 371/43 |
| 4,630,032 | 12/1986 | Gordon et al. | 371/43 |
| 4,715,037 | 12/1987 | Yagi | 371/43 |
| 4,730,322 | 3/1988 | Pollara-Bozzola | 371/43 |
| 4,748,626 | 5/1988 | Wong | 371/43 |
| 4,868,830 | 9/1989 | Pollara-Bozzola | 371/43 |
| 4,881,241 | 11/1989 | Pommier | 371/43 X |
| 4,945,549 | 7/1990 | Simon | 371/43 X |

Primary Examiner—Robert W. Beausoliel

[57] ABSTRACT

A method of formulating and packaging decision-making elements into a long constraint length Viterbi decoder which involves formulating the decision-making processors as individual Viterbi butterfly processors that are interconnected in a deBruijn graph configuration. A fully distributed architecture, which achieves high decoding speeds, is made feasible by novel wiring and partitioning of the state diagram. This partitioning defines universal modules, which can be used to build any size decoder, such that a large number of wires is contained inside each module, and a small number of wires is needed to connect modules. The total system is modular and hierarchical, and it implements a large proportion of the required wiring internally within modules and may include some external wiring to fully complete the deBruijn graph.

47 Claims, 8 Drawing Sheets

| CHIP # 0 | | CHIP # 1 | |
|---|---|---|---|
| LOCAT. | BUTTERFLY | LOCAT. | BUTTERFLY |
| 0 | 000000 | 0 | 000001 |
| 1 | 100000 | 1 | 101000 |
| 2 | 010000 | 2 | 010100 |
| 3 | 110000 | 3 | 110100 |
| 4 | 001000 | 4 | 001010 |
| 5 | 100001 | 5 | 101001 |
| 6 | 011000 | 6 | 011010 |
| 7 | 111000 | 7 | 111010 |
| 8 | 000100 | 8 | 000101 |
| 9 | 100010 | 9 | 101010 |
| 10 | 010001 | 10 | 010101 |
| 11 | 110001 | 11 | 110101 |
| 12 | 001100 | 12 | 001101 |
| 13 | 100011 | 13 | 101011 |
| 14 | 011100 | 14 | 011101 |
| 15 | 111100 | 15 | 111101 |
| 16 | 000010 | 16 | 000011 |
| 17 | 100100 | 17 | 101100 |
| 18 | 010010 | 18 | 010110 |
| 19 | 110010 | 19 | 110110 |
| 20 | 001001 | 20 | 001011 |
| 21 | 100101 | 21 | 101101 |
| 22 | 011001 | 22 | 011011 |
| 23 | 111001 | 23 | 111011 |
| 24 | 000110 | 24 | 000111 |
| 25 | 100110 | 25 | 101110 |
| 26 | 010011 | 26 | 010111 |
| 27 | 110011 | 27 | 110111 |
| 28 | 001110 | 28 | 001111 |
| 29 | 100111 | 29 | 101111 |
| 30 | 011110 | 30 | 011111 |
| 31 | 111110 | 31 | 111111 |

LARGE CONTRAINT LENGTH HIGH SPEED VITERBI DECODER BASED ON A MODULAR HIERARCHICAL DECOMPOSITION OF THE DEBRUIJN GRAPHpg,14

ORIGIN OF THE INVENTION

The invention described herein was made in the performance of work under a NASA contract, and is subject to the provisions of Public Law 96-517 (35 USC 202) in which the Contractor has elected not to retain title.

BACKGROUND OF THE INVENTION

1. Field of the Invention

This invention relates to signal decoding apparatus and more particularly to an improved Viterbi decoder capable of decoding convolutional codes with constraint lengths up to about 15 and code rates of one-half to one-sixth.

2. Description of the Prior Art

A search of the prior art has revealed the following patents:

3,789,360 . . . Clark, Jr., et. al.
4,630,032 . . . Gordon et. al.
4,715,037 . . . Yagi
4,730,322 . . . Pollara-Bozzola
4,748,626 . . . Wong Of the above-noted patents the closest one to the principles of this invention is the one by Pollara-Bozzola ('322 patent) in which a hypercube method and apparatus for formulating a Viterbi decoder is defined and claimed. The trellis comprises states that are assigned to nodes of the hypercube according to a novel algorithm and thus allow for highly parallel Viterbi decoder structures. The issue of how to formulate higher constraint length viterbi decoders, with a practical size, speed, and with efficient wiring of modules operating in parallel, however, is not addressed in this prior art reference. The remaining prior art patents do not teach or suggest the novelty that is described and claimed in this application.

Some additional references of which the inventors are aware are listed in keeping with the inventor's duty of disclosure. Such references are of interest only and include:

4,015,238 . . . Davis
4,493,082 . . . Cumberton et al.
4,500,994 . . . McCallister et al.
4,545,054 . . . Davis Numerous textbooks teach the operation and structure of Viterbi decoding. It is well known that if one wants to increase the constraint length of a Viterbi decoder one must double the number of states in the trellis diagram used for evaluating the various possibilities contained in an input string of convolutionally encoded data to be decoded. It is readily apparent that, as one increases the constraint length, the size and complexity of the decoder grows exponentially. The complexity of the structure, although simple from a theoretical standpoint becomes a packaging nightmare.

A Viterbi decoder finds the maximum-likelihood path through a state trellis, based on the information contained in a stream of encoded symbols, and yields a sequence of decoded information bits. At each information bit time, each state in the trellis must select one of the two possible paths coming into the state. These decisions are based on the accumulated metrics into each state, which represent the likelihood of reaching that state. The accumulated metrics are updated, at each information time, by adding to the previously computed accumulated metric the branch metric associated with the newly received symbols. This viterbi decoding sequence is well known and is implicit in this disclosure. This invention will focus on overcoming the bottleneck of partitioning, packaging and duplicating the electrical circuits needed for long constraint length decoders (K=7, 8, 9, 15, etc.) that must operate at high decoding speeds (one million bits per second and higher).

Since a constraint length 15 Viterbi decoder has $2^{14}$ such trellis states it is a formidable problem to implement the decoder by distributed architecture that makes high decoding speed feasible. When such a decoder is implemented in a fully parallel format, the number of wires and decision making processors totals into the thousands. The longer the constraint length, the more non-trivial the packaging and formulating problem becomes. For example, consider the clocking associated with the decision making processors. Data must be delivered to every processor at the same interval. Even with today's integrated chip technology, the Viterbi decoder's timing, structural, architecture and wiring complexity is a staggering undertaking.

Our invention, for the first time, discloses such high speed long constraint length decoders formulated into a practical system that is compatible with today's technology.

SUMMARY OF THE INVENTION

A standard implementation of a maximum-likelihood convolutional decoder (Viterbi decoder) involves formulating the decision-making processors as individual Viterbi butterfly processors that are interconnected as nodes in a deBruijn graph configuration. Such a deBruijn graph is not known to be readily adaptable for building block construction techniques. In this invention we have introduced a novel partition of the deBruijn graph (so-called "splitting" of deBruijn graphs) inspired by the problem of building a large constraint length viterbi decoder. Such splitting renders the deBruijn graph into identical building blocks (hereinafter referred to as the "crenellated FFT algorithm") that can readily be duplicated as identical modules by VLSI fabrication techniques.

Butterflies are nodes in the deBruijn graph and the edges of the graph represent wires between butterflies. Such a graph requires a full set of $2^{K-2}$ butterflies, which set in our invention is split, or decomposed, into identical modules called boards and the boards are still further decomposed into modules called chips. This partitioning of our invention achieves a maximum amount of wiring that is internal to the modules with a minimum amount of external wiring. This configuration is implemented by a fully distributed architecture having a continuous traceback operation. The system is modular and hierarchical.

Since the modules are identical they can be duplicated as necessary for any given decoder constraint length. We also need some external wiring as interconnections between these modular units. The novel partitioning techniques of this invention have kept the external wiring to a manageable minimum. This invention results in a simpler design, reduced cost, and improved testability and repairability. A constraint length 15 decoder, for example, uses 512 identical VLSI chips and 16 identical printed circuit boards based on this invention's novel partitioning. A decoder of such a constraint length, heretofore thought impractical, can be feasibly designed for decoding at speeds of 1 Mbps (one million bits per second) based upon this invention's partitioning techniques.

BRIEF DESCRIPTION OF THE DRAWING

FIG. 2 includes FIG. 2A which is an Add-Compare-Select circuit and its associated connections that are configured into a butterfly.

FIG. 8 includes FIG. 8A which is the underlying theoretical basis for FIG. 8B, which Figure depicts an alternative embodiment of this invention.

DESCRIPTION OF THE PREFERRED EMBODIMENT

A new Viterbi decoder, capable of decoding convolutional codes with constraint lengths up to 15, at speeds exceeding 1 Mbps (one million bits per second) is under development by the National Aeronautics and Space Adminstration (NASA) for the Deep Space Network (DSN). This application describes a novel partitioning of the decoder's state transition diagram that forms the basis for the new decoder's architecture.

Figure 1:
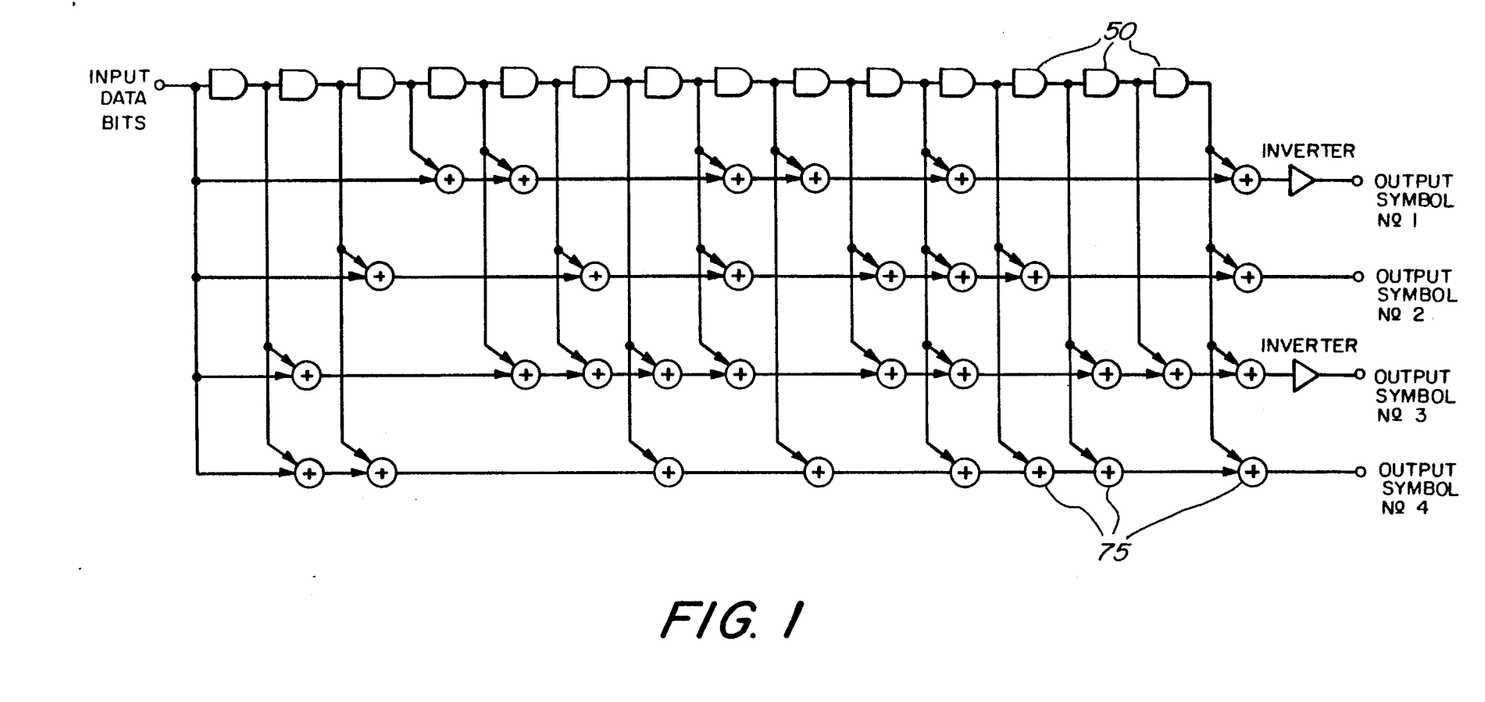
FIG. 1 is a simple logic diagram of an encoder diagram for a convolutional code of constraint length $K=15$.

FIG. 1 is a typical type of encoder for use with a long constraint length viterbi decoder. The encoder 50 receives a string of input data bits, typically in binary format, and recombines them using the exclusive OR circuits 75 which are connected into certain predesignated bit positions as shown in FIG. 1. The encoder will reorganize a string of fifteen input data bits into four output symbols as shown and labeled in FIG. 1. These four output symbols define a one-fourth code rate which is available for transmission in any suitable known manner. After such a code has been transmitted, it will be received, and at the receiving end an appropriate Viterbi decoder is employed to decode the encoded output symbols that have been received at the decoder's location.

The Viterbi algorithm is naturally fully parallel as is well known. However, a fully parallel implementation of a large constraint length Viterbi decoder requires an impractical amount of hardware unless novel and inventive techniques are employed. The first question to be faced when building such a decoder is how much of this well-known parallelism must a practical approach throw away?

We chose to retain a fully distributed architecture for computing and exchanging accumulated metrics (in the well-known Viterbi decoding operation), but to perform the arithmetic computations bit-serially. The arithmetic computations, for a constraint length of $K=15$, are 16-bits long, and the decoding speed will be greater than 1 Mbps with a 20 MHz system clock.

In a fully distributed architecture, there are $2^{K-1}$ basic computational elements called add-compare-select ("ACS") circuits for a constraint length K decoder. When K is large, it is desirable in accordance with this invention to take a modular, hierarchical approach to organizing the huge number of required wires and computational elements. Many add-compare-select/wiring circuits can be implemented on a single VLSI chip, and many chips can be mounted on a single printed circuit board using commonplace backplane and connection techniques. The full decoder is implemented by wiring together the required number of chips and boards.

The main problem overcome by the principles of this invention is wiring. For a code with a constraint length K, the number of states is $2^{K-1}$, so in the $K=15$ decoder there are 16,384 states that must be represented in the basic signal handling elements. How can these large numbers of basic elements, each with two inputs and an output (going to two different elements' inputs), be partitioned into chips and boards without using too many pins per chip or too large a board edge connector? This question is answered by this invention.

Figure 2A:
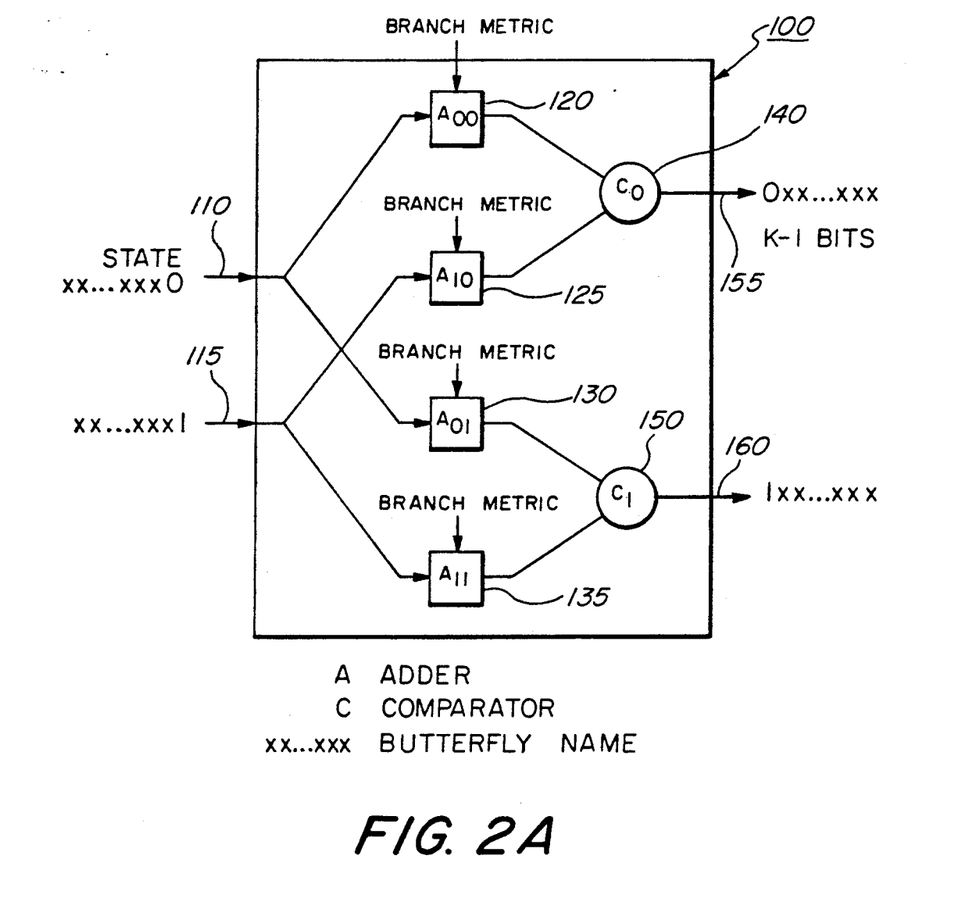

This application shows first how pairs of add-compare-select circuits are grouped to form elements called butterflies. FIG. 2A depicts the elements that make up a butterfly 100. As shown in FIG. 2A an input state's accumulated metric enters on an input pin 110 and it is applied to two adder circuits 120 and 130. Another input state's accumulated metric enters on input pin 115 and it is applied to two other adders 125 and 135. Branch metrics are also supplied, in any well known manner, to these adder circuits. The branch metrics and the timing by derived or external clocks is not shown in detail. Such structure is implicit in this description and is not believed necessary for the invention's disclosure. Further details of such nonessential material, however, is incorporated herein by reference to papers published recently by some of the co-inventors named herein. For example, we incorporate herein by reference, an abstract of a paper which is listed in the ISIT Conference, Japan, Session MB5 entitled Decoding of Trellis Codes, Techniques for Long Constraint Length Viterbi Decoding as presented on June 20, 1988 by a named inventor hereof, Oliver Collins. Another paper of interest is a TDA Progress Report 42-95 dated Nov. 15, 1988 entitled A Long Constraint Length VLSI Viterbi Decoder for the DSN, by J. Statman, G. Zimmerman, F. Pollara, and O. Collins; and another TDA progress Report 42-96 dated Feb. 15, 1989 entitled Wiring Viterbi Decoders (Splitting deBruijn Graphs) by O. Collins, F. Pollara, S. Dolinar and J. Statman. In particular, incorporated by reference herein, is the description and FIGS. 4, 5, 6, 7, and 8 of the first TDA progress report dealing with implicit details for Viterbi decision making and timing processes. Another open literature publication, including several theorems of interest which are incorporated herein by reference, is due to be published in the Journal of the ACM entitled A VLSI Decomposition of the deBruijn Graph by O. Collins, S. Dolinar, R. McEliece, and F. Pollara. In the last-mentioned mentioned paper, theorems 3.4, 4.3, 4.6 and all of Sections 1 and 6 are incorporated herein by reference.

Returning again to FIG. 2A, comparison circuit 140 is connected to adder circuits 120 and 125, while another comparison circuit 150 is connected to adder circuits 130 and 135. These add-compare-select circuits, in the manner shown in FIG. 2A, take inputs from the same pair of states. The output of one of these goes to a state obtained by discarding the rightmost bit of the input states and prefixing a 0 on the left. This operation provides the output result shown on the upper right output pin 155. The output of the other add-compare-select circuit goes to the state defined similarly but with a prefixed 1 instead of 0, as is shown for the lower right output pin 160.

In Summary, the butterfly 100 of FIG. 2A has two input wires 110, 115 and two output wires 155, 160 for transmission of accumulated metrics. As just described each butterfly needs only four wires, because its two add-compare-select circuits get their inputs from the same pair of states. That butterfly's two add-compare-select circuits, it is known, can share the same hardware for computing branch metrics. These facts make butterflies natural elements to work with. This invention achieves novel results by using butterflies connected into "crenellated FFT-type" chips which in turn are used to form the decoder.

The invention requires butterfly labeling, addressing and connecting which is a significant task. Before describing our novel approach to this task, it is believed helpful to digress momentarily and discuss the overall requirements of a constraint length K=15 decoder.

For a constraint length of K=15, there will be $2^{K-2}$ or 8,192 butterflies. The connection diagram of these $2^{K-2}$ butterflies is a deBruijn graph in which the butterflies are graph nodes and the edges of the graph represent wires between butterflies. In accordance with this invention a set of $2^{K-2}$ butterflies can be split into modules called boards and the boards split into modules called chips. All of the modules or submodules of a given size are identical. This splitting is done in such a way that a large proportion of the required connections between butterflies are implemented internally within the modules. Furthermore, their internal structure does not depend on the size of decoder, and an appropriate number of board modules and chip modules can be wired together to make any size decoder at least equal to the size of the module.

The constraint length 15 Viterbi decoder under development for the DSN is currently being designed with 16 boards and 512 chips. Each chip in this design contains 16 butterflies, and each board has 32 chips. However, the theory developed in this invention is completely general and produces a modular, hierarchical partitioning of any size deBruijn graph into any number of first-level and second-level subgraphs (boards and chips, respectively). The exposition of the theory and the examples in this invention are selected without reference to the specific configuration chosen for the DSN's new decoder.

All $2^{K-1}$ states in a constraint length K Viterbi decoder are labeled with (K-1)-bit binary strings. An add-compare-select circuit takes as inputs the accumulated metrics of two states whose labels differ only in the rightmost bit. Each of these accumulated metrics has a different branch metric added to it and the smaller of the two sums is selected.

Figure 2B:
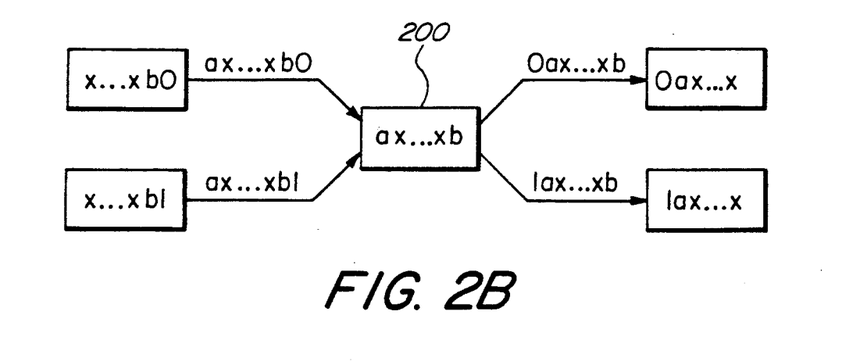
FIG. 2B depicts one butterfly's required connections to its four neighbors in the deBruijn graph.

FIG. 2B depicts butterfly connections and labeling as applied to an arbitrary butterfly 200. A butterfly is labeled, for purposes of partitioning and packaging in accordance with this invention, by dropping the rightmost bit of the label of either of its input states. Thus note that the centermost butterfly 200, FIG. 2B, is labeled ax ... xb since the rightmost bit ("0" or "1") of its two inputs has been discarded. Each node in this graph is labeled by a (K-2)-bit binary string and each edge is labeled by a (K-1)-bit binary string. Each node is connected to four other nodes via four directed edges. A node receives its inputs via the pair of edges obtained by appending a 0 or 1 to the right of the node's label, and it sends its outputs via the pair of edges obtained by prefixing a 0 or 1 to the left of the node's label.

The full deBruijn graph of $2^{K-2}$ butterflies requires exactly $2^{K-1}$ wires for the exchange of accumulated metrics. This total number of connections cannot be increased or reduced by any wiring scheme. However, it is advantageous to capture as many of these required connections as possible within identical, small, modular units (chips and boards). Wires internal to modules can be easily implemented in today's very large scale integration approaches by duplicating the small module's simple wiring diagram, while external wires between modules must be implemented on a custom-oriented wire-by-wire technique.

A. FUNDAMENTALS OF THE PARTITIONING TECHNIQUES

Figure 3:
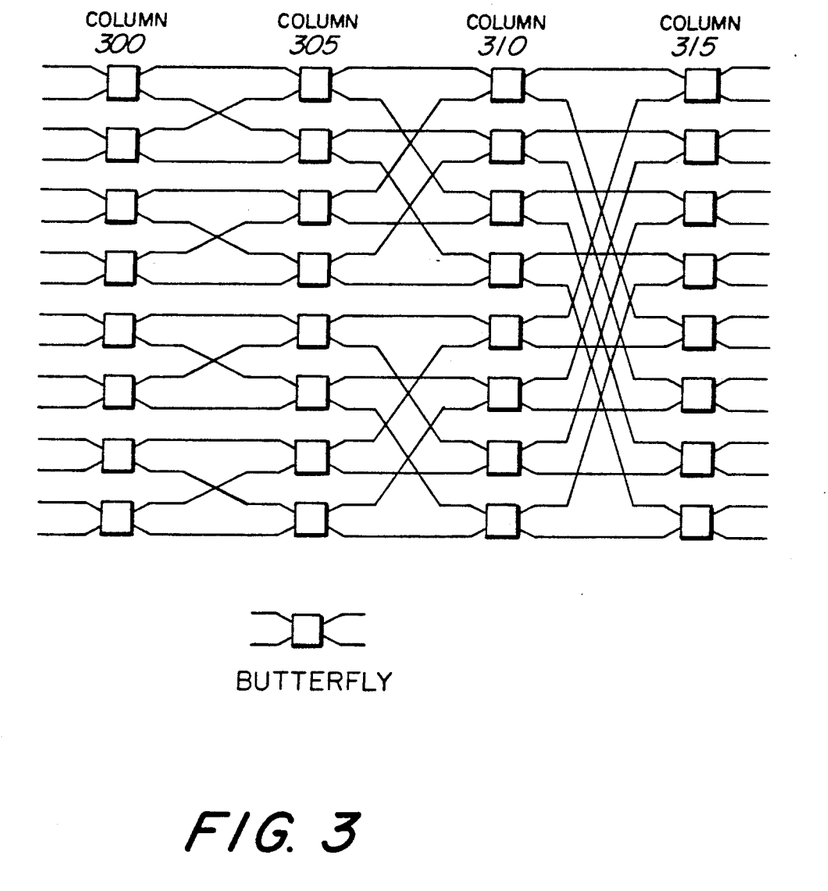
FIG. 3 depicts a connection diagram for an 8 by 4-stage ordinary FFT layout suitable for VLSI techniques.

This invention employs a wiring approach which is based on well known Fast Fourier Transform (FFT)-type VLSI butterfly connection patterns. FIG. 3, in contrast, depicts a pseudo-module containing 32 butterflies that are connected in a standard 8 by 4-stage FFT pattern. Such a standard pattern implicitly includes clocking and processing capabilities, and such capabilities requires no further detailed description. FIG. 3 is presented in this patent application in order to contrast an ordinary pattern (FIG. 3) with the new and improved crenellated FFT-type, or punctured, butterfly pattern (FIG. 4) that is a key feature of this invention. Moreover FIG. 3 is useful to use as an explanation tool since the arrangement of nodes on FIG. 3 has a normally accepted terminology that can be used to advantage in explaining the detailed concepts of this invention. However, the full FFT-pattern in FIG. 3 cannot be directly used as a modular building block for a large Viterbi decoder, without the puncturing of nodes specified in this invention.

Modules (chips and boards) in this invention are constructed from disjoint subsets of butterflies called roots. Each module contains a subgraph of the full-FFT pseudo-module, FIG. 3. Each module contains root butterflies (the vertical column 300 on the extreme left), first-generation descendants (column 305) of these roots (column 300), descendants (column 310) of these descendants, (column 305) and so forth. The descendants of a butterfly, as used in this patent application, are the two butterflies to which an earlier butterfly sends its outputs as seen in FIG. 2B. The invention's module contains all descendants at each generation except those that are roots of another module. The full-FFT graph is punctured at those nodes which are roots of another module, and there are additional punctures eliminating all of a punctured node's descendants. The invention's module is expressed as a "crenellated FFT-type algorithm".

Such a crenellated FFT algorithm has several rules of definition that should be followed in order to build a long constraint length decoder with fully distributed architecture which is capable of operating at high decoding speeds as defined in this patent application. For example, if a set of $2^b$ root butterflies is consecutive in the last b bits (i.e., the last b bits take on all possible values and all other bits are the same), then their descendants through b generations are a block of butterflies obtained by cyclic shifting the roots by b bits or less. A module containing the roots and all of these descendants would have (b+1) stages, as shown in FIG. 3. Unfortunately, it is impossible to completely partition the deBruijn graph into nonoverlapping full-FFT modules of the type described in connection on with FIG. 3; and thus a module's connection diagram, in accordance with this invention, must be punctured at those nodes corresponding to root nodes of another module that also has the identically same crenellated FFT algorithm.

Figure 4:
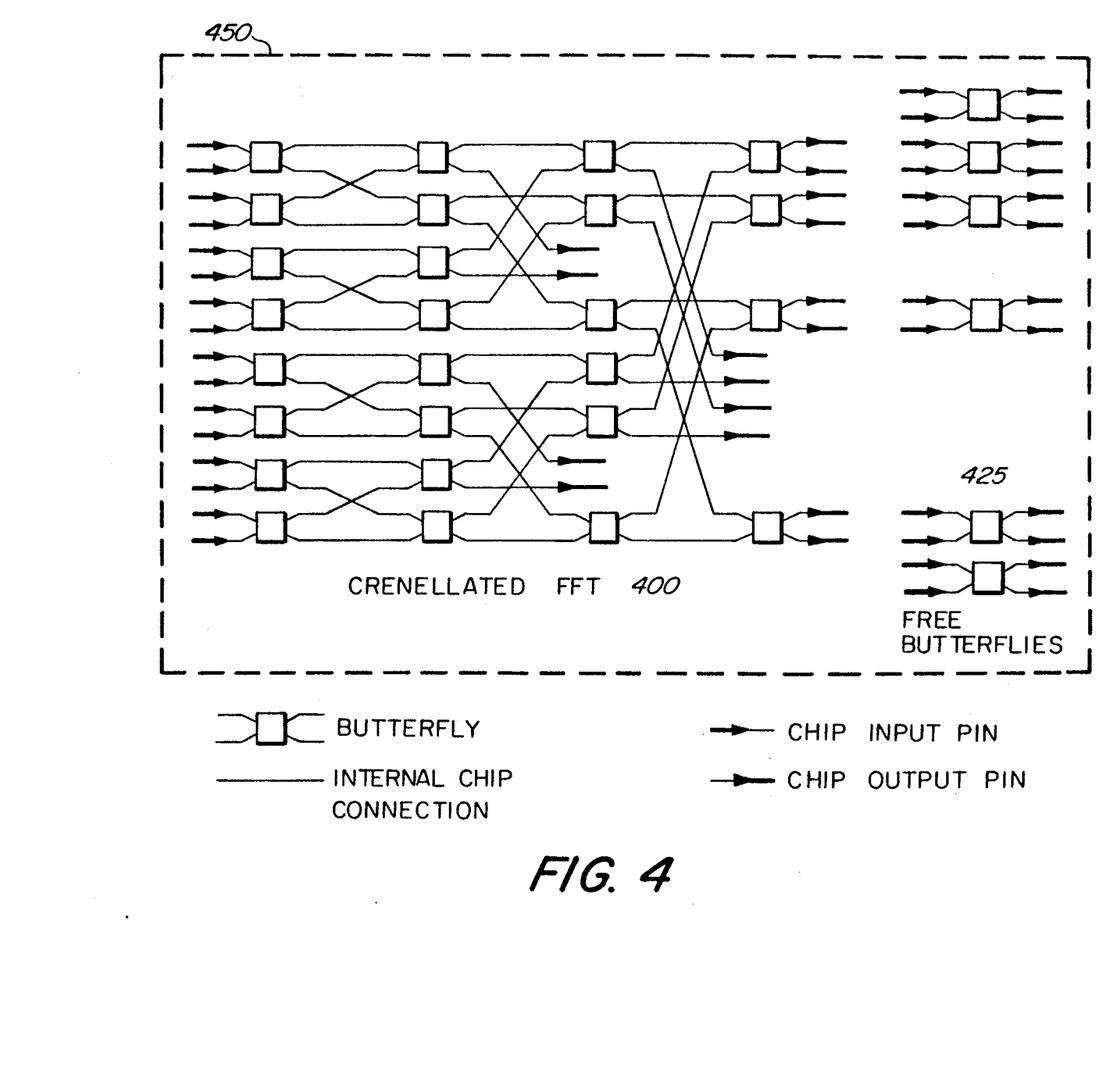
FIG. 4 is a connection diagram for a thirty-two butterfly chip having a crenellated FFT-type pattern and free butterflies included thereon in accordance with the principles of this invention.

The result of such puncturing is a crenellated FFT-type butterfly connection pattern 400 as legended in FIG. 4. Note that a comparison of FIG. 3 with FIG. 4 shows that some of the second and third generation butterflies from columns 310 and 315, FIG. 3, have been eliminated from the module and replaced by an equal number of "free" butterflies, such as group 425 on the rightmost side of the chip 450. The crenellated FFT-type graph 400 is a subgraph of the full FFT given by FIG. 3 and the free butterflies 425 complete the module.

If the root butterflies are selected wisely in accordance with this invention, most of the full decoder's $2^{K-2}$ butterflies are found in some module's crenellated FFT-type butterfly connection diagram. However, some butterflies do not belong to any crenellated FFT. These butterflies (group 425) are "free" in the sense that their wiring is not specified by the crenellated FFT-type butterfly construction of FIG. 4. The free butterflies of course are also fabricated by VLSI technology and must physically reside within a module. Their connections to other butterflies, however, must be implemented by external wiring (i.e. wiring that is outside the module(s) in order to assemble a Viterbi decoder. If such external wiring were not consistently employed the modules' internal wiring would not be identical and thus a main advantage of this invention would be lost. Such identicality, as provided for by this invention, offers numerous benefits in duplicating, fabricating, etc. as mentioned earlier.

A module based on the crenellated FFT-type butterfly construction thus contains two types of butterflies. The majority of butterflies belong to a crenellated FFT-type pattern 450, and some or all of their required connections are implemented by internal wiring (within the module) which is identical from module to module. The remaining free butterflies 425, FIG. 4, have only input output pin and internal connections fabricated in VLSI, but communicate via four external pin-connectors that are formed from, or are tied to, external non-chip wiring (two internal pins for inputs and two internal pins for outputs per each "free" butterfly).

For the DSN's new Viterbi decoder, the set of root butterflies is taken to be the set of all $2^{K-4}$ butterflies having the common prefix 10. This selection of root butterflies works well (i.e., captures a large fraction of wires within modules) for module sized from $2^4$ to about $2^9$ butterflies. The full block of root butterflies is subdivided into consecutive blocks of roots for board modules, which are further subdivided into consecutive blocks of roots for the chip modules on each board. The crenellated FFTs generated from these root butterflies are hierarchical in the sense that the crenellated FFTs for the board is constructed without breaking any of the connections in the crenellated FFTs for the chips on the board.

A single shift of a string having 10 as a prefix cannot produce another string having 10 as a prefix. Hence, for modules constructed from $B_0 = 2^b$ consecutive root butterflies with the prefix 10, the number $B_1$ of first-generation descendants in the crenellated FFT equals the number of roots $B_0$. The number of butterflies $B_g$ in each succeeding generation g of the crenellated FFT is given by the linear recurrence $$B_g = B_{g-1} - B_{g-2}/4,$$

for $2 \leq g \leq b = \log_2 B_0$. The module only contains descendants through the bth generation; (b+1)th-generation descendants cannot be included because their parent nodes belong to two different modules. It can be shown by evaluating the recursion formula that the number of free butterflies is b+3 and the total number of butterflies in the module (free butterflies plus butterflies in the crenellated FFT) is $2^{b+2}$ or four times the number of roots. The number of external wires[1] leading off the module is an indication of the wiring efficiency of the modular decomposition.

[1] External wire and pin counts quoted in this application refer only to the wires required for exchange of accumulated metrics and do not include additional wires and pins needed for power and so forth because such other requirements are well known and do not form part of this invention.

FIG. 4 shows the connection diagram for a 32-butterfly butterfly chip module based on roots with the prefix 10. The crenellated FFT-type pattern is on the left and the six free butterflies on the right have all their wires leading off chip. The crenellated FFT for the chip starts with eight root butterflies and continues for three generations of descendants from these roots. The crenellated FFT resembles an ordinary 8×4-stage FFT, except for punctures eliminating six of the nodes, which eliminated nodes are replaced by free butterflies in this invention. The number of external wires per a 32-butterfly chip is 56.

Table 1 sets forth a listing of the number of external wires required for different module sizes which can be configured to form Viterbi decoders of arbitrary constraint lengths. For the larger module sizes, the table shows that the number of external wires is approaching a lower bound of one external wire per butterfly. This table in a dramatic way shows that our invention is highly efficient. The crenellated FFT-type configuration maximizes the number of internal wires and minimizes the number of external wires, relative to previously known straightforward deBruijn graph decompositions which require four external wires per butterfly. Table 1 is presented below and below table 1 is a mathematical formula which also expresses these relations in a more generalized way.

TABLE 1

| Module Size Number of butterflies | Number of external wires, W | External wires per butterfly, w |
|---|---|---|
| 4 | 16 | 4.00 |
| 8 | 24 | 3.00 |
| 16 | 36 | 2.25 |
| 32 | 56 | 1.75 |
| 64 | 92 | 1.44 |

TABLE 1-continued

| Module Size Number of butterflies | Number of external wires, W | External wires per butterfly, w |
|---|---|---|
| 128 | 160 | 1.25 |
| 256 | 292 | 1.14 |
| 512 | 552 | 1.08 |
| 1024 | 1068 | 1.04 |
| 2048 | 2096 | 1.02 |
| 4096 | 4148 | 1.01 |
| 8192 | 8248 | 1.01 |
| 16384 | 16444 | 1.00 |

The table may also be expressed more generally as:

$$W = 2^{b+2} + 4(b+3),$$

$$w = 1 + (b+3)2^{-b}$$

where $2^{b+2}$ is the size of the module (number of butterflies), W is the total number of external wires, and w is the number of external wires per butterfly.

We have lower bounds on the number of edges crossing cuts which divide the nodes of a deBruijn graph into sets of equal or almost equal cardinality. These follow from the very small number of short cycles in the graph and do not depend on the sets' having identical internal connections. The present module design is less than a factor of two away from these bounds.

B. BUTTERFLY ADDRESSING

Each butterfly, labeled by a (K-2)-bit binary string, must also be assigned a (K-2)-bit address or location. The full address specifies the butterfly's exact position in the modular hierarchy. The most significant bits of the address correspond to the butterfly's board and chip location. For example, in a $2^4$-board/$2^8$-chip configuration for a constraint length 15 decoder ($2^{13}$ total butterflies), the four most significant bits of the address specify the board, and the next four bits specify the chip within a board. The five least significant bits of the address specify the position of the butterfly within a chip.

The addressing formula is somewhat arbitrary, but it must satisfy two basic conditions: 1) It must be a one-to-one mapping from (K-2)-bit butterflies to (K-2)-bit addresses and 2) it must be consistent with the partition of the deBruijn graph into crenellated FFTs, i.e., all butterflies assigned to certain chip and board locations by the crenellated FFT construction should be mapped to those same locations by the addressing formula. Free butterflies may be mapped to any convenient free address.

The specification of a butterfly's (K-2)-bit address proceeds as follows. First, compute the butterfly's partial address by dropping from its (K-2)-bit label all of the most significant bits through and including the first occurrence of the string 10. The partial address consists of all the bits to the right of the first 10, and it is empty if there is no occurrence of 10 in the butterfly's (K-2)-bit label or if 10 first occurs in the two least significant bits. The partial address is the only part of the full address that is specified by the crenellated FFT partition. For example, in a $2^8$-chip decoder, a partial address of 8 bits will determine exactly which chip a given butterfly belongs to, but a butterfly with a partial address of 7 bits or less is one of the free butterflies that is not assigned to any chip's crenellated FFT.

The partial address sets the most significant bits of a butterfly's full address. The remaining part of the address, called arbitrary bits, is completely arbitrary in the sense that any choice will be consistent with the crenellated FFT construction. However, the arbitrary bits for all butterflies must be chosen in a way that assigns each (K-2)-bit butterfly to a unique (K-2)-bit address. One simple rule for guaranteeing a one-to-one mapping is to choose the arbitrary bits as the reversal of the most significant bits (through and including the first occurrence of 10) that were dropped to extract the partial address. Then, if this rule is adopted, the butterfly's address is computed from the butterfly's label according to:

butterfly = (prefix, partial address) = ($\rho$(suffix), partial address)

address = (partial address, suffix) = (partial address, $\rho$(prefix)), where suffix are the arbitrary bits and prefix are the most significant bits of butterfly up to and including the first occurrence of 10. The notations $\rho$(prefix) and $\rho$(suffix) denote the reversals of the indicated bit strings. For example, a butterfly label that is (abcde10, fghijk) gives a butterfly address that is (fghijk 01edcba), assuming that abcde does not contain the string 10.

The above-described addressing rule produces a one-to-one mapping because it is obviously invertible. Given any (K-2)-bit address, first determine the partial address by dropping all of the least significant bits through and including the last occurrence of 01. The dropped bits are the arbitrary bits. Now compute the unique butterfly label corresponding to that address by concatenating the reverse of the arbitrary bits with the partial address.

C. BUILDING MODULAR DECODERS

Figure 5:
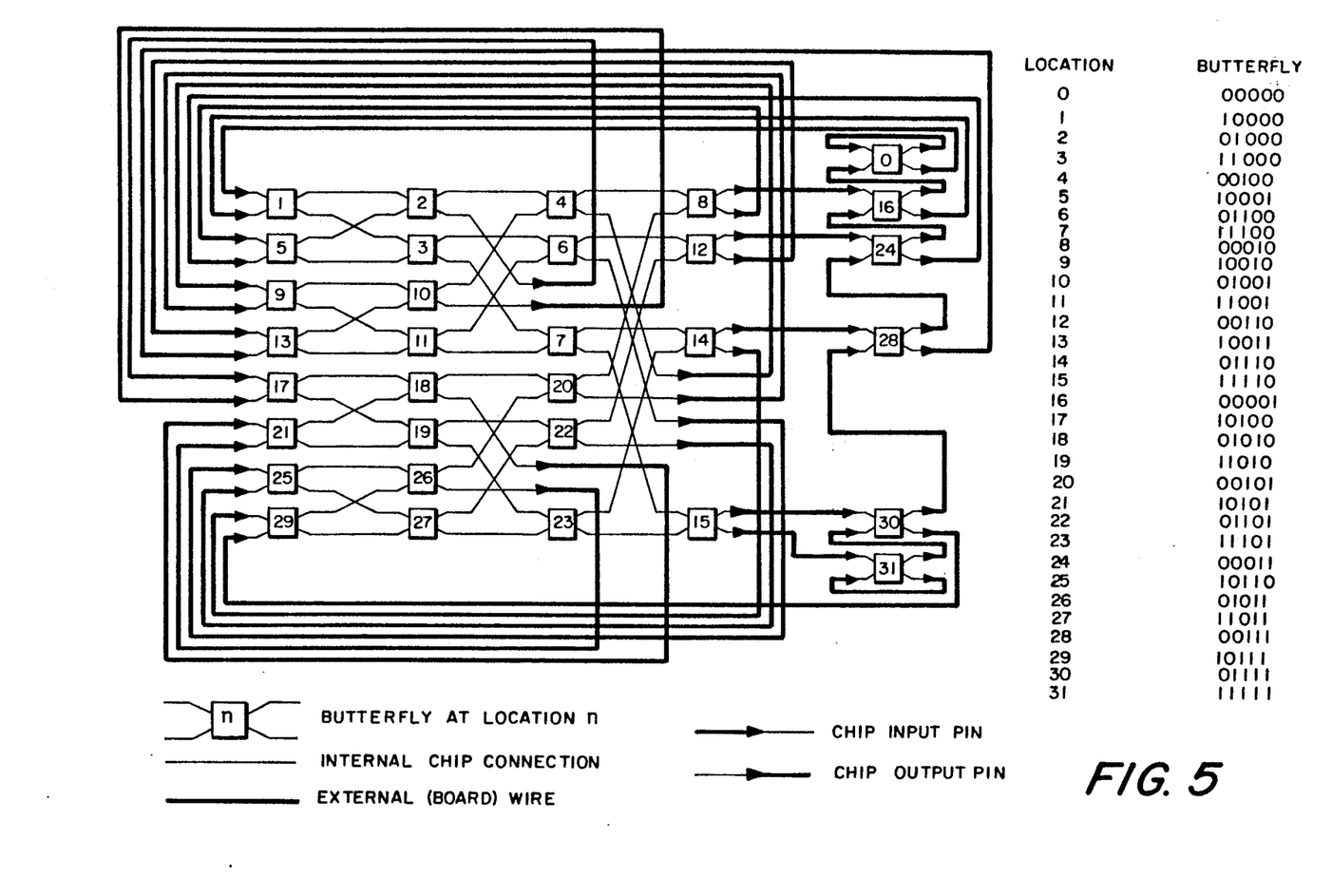
FIG. 5 depicts a 32-butterfly chip in accordance with FIG. 4 and includes additional external wiring connections necessary to form a Viterbi decoder having a constraint length of $K=7$.
Figure 6:
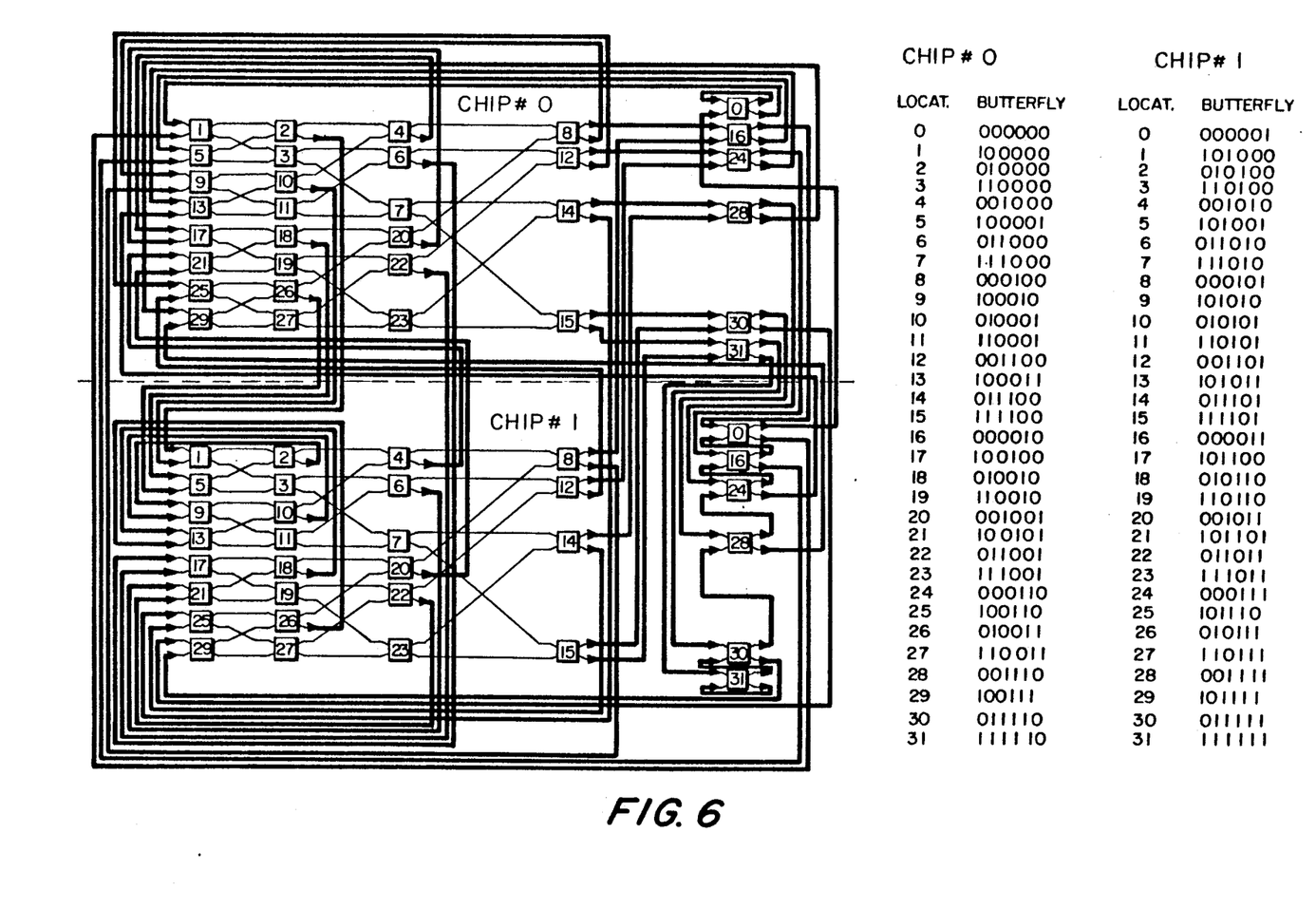
FIG. 6 depicts two thirty-two butterfly chips of FIG. 4 wired into a Viterbi decoder having a constraint length of $K=8$.

The board and chip modules defined by the crenellated FFT construction have the property that full Viterbi decoders of all sizes at least equal to the size of the module can be constructed by appropriately connecting identical copies of the module, without revising the internal wiring within any module. FIG. 5 shows a 32-butterfly chip wired as a constraint length 7 decoder, and FIG. 6 shows two 32-butterfly chips wired as a constraint length 8 decoder. Arrows correspond to chip pins and heavy lines represent external wires between chip pins. Thin lines represent internal connections within the chip. Note that many of the heavy lines in FIG. 6 connect butterflies within the same chip, as do all of the heavy lines in FIG. 5. However, these connections cannot be incorporated internally within the chip, because the chip would no longer be a universal module, i.e., some larger constraint length decoder could not be built from the more tightly wired chips.

A legend is presented at the righthand side of FIG. 5 that is useful for identifying the label of the butterfly assigned to each location within the module. The detailed rules for connections, labeling and addressing as defined for this invention are in keeping with the description of FIG. 2B and the additional description given in section B. hereinbefore. This legend of FIG. 5 is not believed to require further explanation since it is self explanatory when considered in view of the connections and descriptors of FIG. 4 and the earlier description for FIGS. 2A and 2B.

FIG. 6 is a mostly self explanatory drawing of two 32-butterfly crenellated FFT-type modules that have been wired externally as shown by the darker lines of the drawing as per FIG. 5's legend that is also used for FIG. 6. The table to the righthand side of FIG. 6 is again indicative of the location and butterfly labeling in accordance with this invention. FIG. 6 depicts a viterbi decoder of constraint length K=8 and it is not believed to require any further description.

Figure 7:
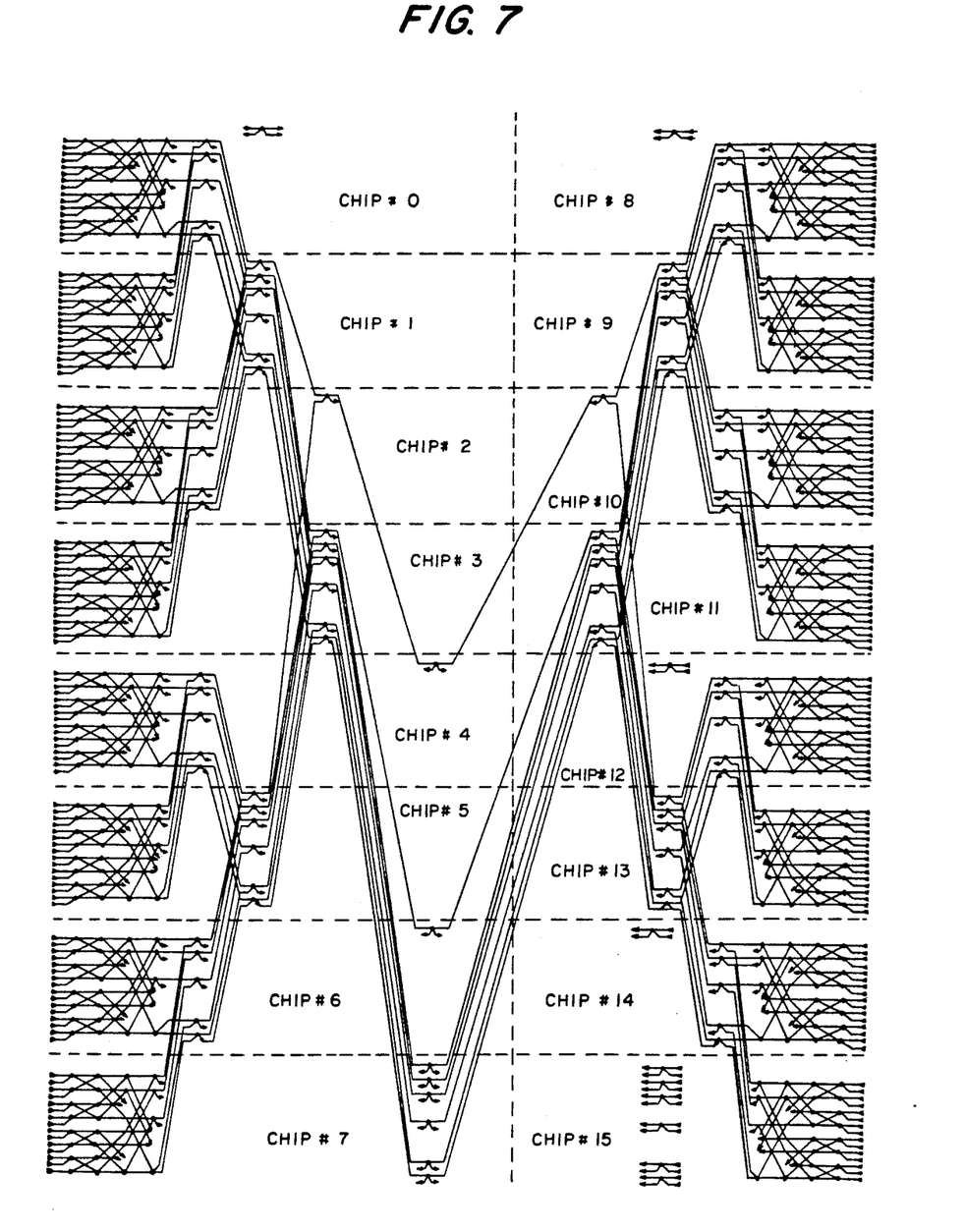
FIG. 7 is a connection diagram for a 512-butterfly board containing 16 32-butterfly chips as used for higher constraint length decoders in accordance with this invention.

FIG. 7 shows the connection pattern for a 512-butterfly board module based on roots with the prefix 10. The crenellated FFT contains 128 roots and 7 generations of descendants. The 128×8-stage FFT-type template (a larger version of FIG. 4) is obvious, even though over half the nodes from this template are missing in the crenellated version. The crenellated FFT structure includes 502 of the board module's 512 butterflies, leaving just 10 free butterflies per board. The number of external wires per 512-butterfly board is 552, just over 1 wire per butterfly (about half as many external wires as for a same-size module based on the alternative embodiment construction of our invention as shown in FIG. 8 and discussed in more detail hereinafter).

FIGS. 4 through 7 illustrate how the definition of the first-level subgraph (a board) is completely consistent with the definition of the second-level subgraph (a chip). The 512-butterfly board in FIG. 7 is built from sixteen of the 32-butterfly chips in FIG. 4. In FIG. 7 arrows correspond to chip pins, and unconnected arrows represent board pins (which must be connected to pins on other boards via the backplane). The dots are butterfly nodes in FIG. 7. Heavy lines represent wires on the board between chip pins, and thin lines represent internal connections within the chip. Pictorially, the crenellated FFT portions of eight of the sixteen chips in FIG. 7 are identical copies of the crenellated FFT portion of the chip in FIG. 4, and the crenellated FFT portions of the other eight chips are depicted by their mirror images (for convenience of display). Similarly, the depictions of the six free butterflies in each chip are displaced horizontally by varying amounts to emphasize the crenellated FFT-type structure and pattern of the VLSI layout of the board.

The hierarchical nature of the crenellated FFT construction holds not just for 32-butterfly chips and 512-butterfly boards but also for all other module sizes $2^{b+2}$. Each module constructed from consecutive roots with the prefix 10 can be built from two modules half its size constructed from the same type of roots.

Chip and board modules may include some additional internal connections if they are destined only for a particular size of decoder (e.g., just the constraint length 15 decoder). Also, by restricting the decoder to constraint lengths 15 and larger and allowing one of the boards to be different from the others, we can reduce the number of wires between boards without changing the chips. These facts give some flexibility if the backplane were to present some unexpected wiring problems.

D. ALTERNATE EMBODIMENT

Figure 8A:
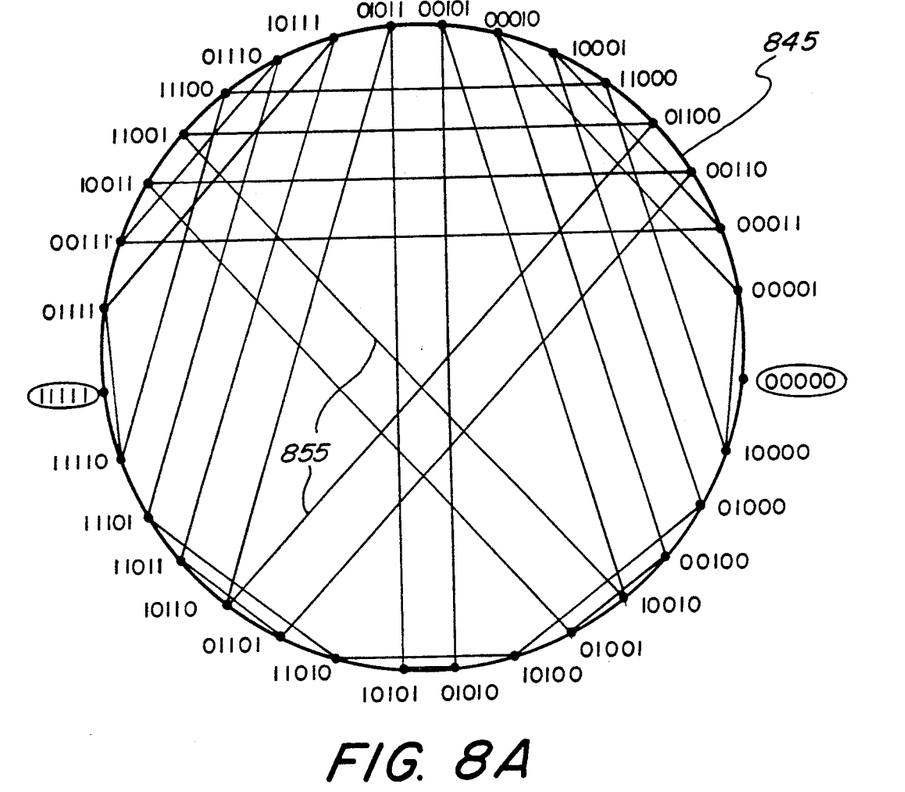
Figure 8B:
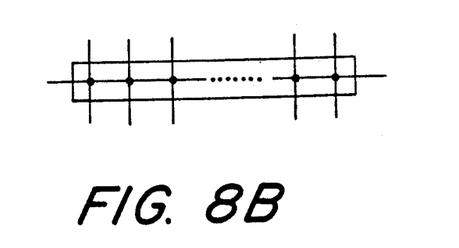

Another mathematically appealing way of creating identical modular units that incorporates a reasonable proportion of internal wires is to exploit one of the Hamiltonian paths of the deBruijn graph. A known Hamiltonian path structure is depicted in FIG. 8, where each node is depicted by a dot. These nodes correspond to butterflies, and one of the two outputs of each butterfly is connected to one of the two inputs of another butterfly in a large ring 845 (FIG. 8a). This ring contains all of the butterflies and half of their connections. The remaining half of the connections (such as connections 855) form an irregular pattern across the interior of the ring, as illustrated in FIG. 8A. Identical modules can be constructed by slicing the Hamiltonian ring into equal-size linear segments (FIG. 8B). Almost half of the wires required for accumulated metric exchange can be implemented internally within the modules. The total number of external wires required for a module of size $2^b$ is $$W = 2^{b+1} + 2$$

and the number of external wires per butterfly is $$w = 2(1 + 2^{-b}).$$

E. OTHER DESIGN APPLICATION OF THE INVENTION

There are, of course, additional devices which may be constructed in accordance with the principles of our invention that are unrelated to building practical Viterbi decoders of unusually long constraint lengths. For example, our modular decomposition of the deBruijn graph might be useful for building spectrum analyzers and very large multipliers based on the well known Schronager-Strassen algorithm.

Such other applications of the principles and features of this invention will be well recognized to those of ordinary skill in this art and need no further description. Suffice it to say at this point that the principles described and claimed herein are limited only by the appended claims when construed in accordance with the applicable construction and interpretation tenets of the Patent Laws.

What is claimed is:

1. A method of partitioning a well-known deBruijn graph of arbitrary size (i.e., containing an arbitrary number of nodes 2G, where G is any positive whole integer, with such nodes being connected according to the prescribed connectivity of the deBruijn graph), wherein such method is characterized by the steps comprising:

dividing the deBruijn graph into identical internally wired modules, with provisions for additional external wires between modules as necessary to complete said connectivity of said deBruijn graph; and formulating a Viterbi decoder, or any other suitable device having deBruijn graph connectivity, from said modules formed by said dividing step.

2. The method of partitioning said deBruijn graph in accordance with claim 1 wherein said dividing is hierarchical and said formulating step is therefore further characterized by:

assembling modules of size $2^b$ by wiring together modules of any smaller size $2^{b'}$, where b and b' are any positive integers with b' less than b.

3. The method of partitioning said deBruijn graph in accordance with claim 2 wherein said dividing step is further characterized as comprising:

mapping a crenellated FFT structure of nodes, together with an arbitrary assignment of free nodes not found within any module's crenellated FFT structure from modules of any size $2^{b+2}$, $b \geq 0$, where b is any non-negative integer.

4. The method of partitioning said deBruijn graph in accordance with claim 3 wherein the said formulating step is further characterized by:

mapping each crenellated FFT structure so that each one comprises:

blocks of $2^b$ consecutive root nodes with labels containing the prefix "10" (in binary notation), and continuing in an FFT-like connection pattern with first-generation descendants of these nodes, next-generation descendants of these descendants, and so forth through the bth generation, except for punctures occurring at any point where a descendant equals a root node of another module.

5. The method of partitioning said deBruijn graph in accordance with claim 3 wherein said formulating step is further characterized as comprising:

said crenellated FFT structure is characterized as comprising blocks of $2^b$ consecutive root nodes with labels containing the prefix "01" (in binary notation), and continuing in an FFT-like connection pattern with first-generation descendants of these root nodes, next-generation descendants of these descendants, and so forth through the bth generation, except for punctures occurring at any point where a descendant equals a root node of another module.

6. The method of partitioning said deBruijn graph in accordance with claim 5 wherein said dividing step is further characterized by:

mapping the free nodes, as well as the nodes belonging to crenellated FFT structures into unique locations in the modular hierarchy according to a one-to-one addressing formula.

7. The method of partitioning said deBruijn graph in accordance with claim 6 wherein said addressing formula is further characterized by the step of:

calculating a node's address as all of the bits (if any) of the node's label following the first occurrence (if any) of "01" in the label, concatenated with a sequence of bit obtained by reversing the order of all of the rest of the bits including the first "01" (if any).

8. The method of partitioning said deBruijn graph in accordance with claim 3 and wherein said method is further characterized by the additional steps of:

specifying the number of internal wires or connections ("$C_{int}$") inside a module which contains $2^{b+2}$ nodes in accordance with $C_{int}=3(2^{b+2})-2(b+3)$; and further specifying the number of external wires or connections ("$T_{ext}$") required to complete the deBruijn graph connectivity of a module containing $2^{b+2}$ nodes in accordance with $T_{ext}=2^{b+2}+4(b+3)$.

9. The method of partitioning said deBruijn graph in accordance with claim 3 wherein said dividing step is further characterized by:

mapping the free nodes, as well as the nodes belonging to crenellated FFT structures into unique locations in the modular hierarchy according to a one-to-one addressing formula.

10. The method of partitioning said deBruijn graph in accordance with claim 3 and further characterized by the steps of:

mapping the free nodes, as well as the nodes belonging to crenellated FFT structures into unique locations in the modular hierarchy according to a one-to-one addressing formula; and calculating a node's address as all of the bits (if any) of the node's label following the first occurrence (if any) of "10" in the label, concatenated with a sequence of bits obtained by reversing the order of all of the rest of the bits of the label including the first "10" (if any).

11. The method of partitioning said deBruijn graph in accordance with claim 10 and further characterized by:

specifying the number of internal connections ("$C_{int}$") inside a module which contains $2^b$ nodes in accordance with $C_{int}=2^b-1$; and further specifying the number of external terminals ("$T_{ext}$") required to complete the deBruijn graph connectivity of a module containing $2^b$ nodes in accordance with $T_{ext}=2^{b+1}+2$.

12. The method of partitioning said deBruijn graph in accordance with claim 2 and further characterized as comprising:

constructing modules of any size $2^b$, $b \geq 0$, from a linear chain of nodes; and designating such linear chains from consecutive linear segments of nodes along any well-known Hamiltonian path of the deBruijn graph.

13. A long constraint length maximum likelihood convolutional decoder (Viterbi decoder) capable of operating at high decoding speeds (one million bits per second and higher) heretofore thought impractical, comprising:

decision-making means comprising individual decision-making units organized according to a fully distributed decoder architecture; and said decision-making units arranged in a butterfly configuration, connected to form a Viterbi decoder by a known deBruijn graph having the butterflies connected as nodes according to the prescribed connectivity of the deBruijn graph; and said distributed decoder architecture is further characterized by employing one butterfly processor for each pair of possible encoder states.

14. A Viterbi decoder in accordance with claim 13 and further characterized by:

said decision-making units including means for performing bit-serial operations to obtain metrics associated with said Viterbi states.

15. A Viterbi decoder in accordance with claim 13 wherein the decoding operation is further characterized by:

means performing a traceback operation on decoding decisions made by the decision-making units.

16. A Viterbi decoder in accordance with claim 13 and said deBruijn graph is further characterized by:

modular units that serve as building blocks for Viterbi decoders of any given one of said long constraint lengths, with said modular units being formed by splitting said deBruijn graph into identical modular units.

17. A Viterbi decoder in accordance with claim 16 and further characterized by:

said modular units of any size $2^b$ butterfly processors may be assembled by wiring together said modular units of any smaller size $2^{b'}$ butterfly processors, where b' and b are any positive integers with b' less than b; and modular units of size $2^b$ butterfly processors may be assembled by wiring together to form a Viterbi decoder of any constraint length K greater than or equal to $b+2$.

18. A Viterbi decoder in accordance with claim 17 and further characterized by:

modular units of any size $2^{b+2}$, $b \geq 0$, are constructed from a crenellated FFT structure of butterfly processors, together with an arbitrary assignment of free butterfly processors not found within any modular unit's crenellated FFT structure.

19. A Viterbi decoder in accordance with claim 13 and said deBruijn graph is further characterized by:
said modular units containing equal numbers of identical butterfly processors.

20. A Viterbi decoder in accordance with claim 19 and further characterized by:
modular units of any size $2^{b+2}$, $b \geq 0$, are constructed from a crenellated FFT structure of butterfly processors, together with an arbitrary assignment of free butterfly processors not found within ay modular unit's crenellated FFT structure.

21. A Viterbi decoder in accordance with claim 19 and said crenellated FFT structure is further characterized as:
comprising blocks of 2b consecutive root butterfly processors with labels containing the prefix "01" (in binary notation), and continuing in an FFT-like connection pattern with first-generation descendants of these roots, next-generation descendants of these descendants, and so forth through the bth generation, except for punctures occurring at any point where a descendant equals a root of another modular unit.

22. A Viterbi decoder in accordance with claim 19 and further characterized by:
modular units of any size $2^b$, $b \geq 0$, are constructed from a linear chain of butterfly processors; and
such linear chains are constructed from consecutive linear segments of butterfly processors along any well-known Hamiltonian path of the deBruijn graph.

23. A Viterbi decoder in accordance with claim 22 and further characterized by:
a first number of internal wires ("$W_{int}$") inside a modular unit containing $2^b$ butterfly processors is specified as $W_{int} = 2^b - 1$; and
a second number of external pins or terminals ("$P_{ext}$") required to complete the deBruijn graph connectivity of a modular unit containing $2^b$ nodes is specified as $P_{ext} = 2^{b+1} + 2$.

24. A Viterbi decoder in accordance with claim 19 and said deBruijn graph is further characterized by:
each of said modular units containing internal preconnected wiring between butterfly processors in it's own modular unit, which internal wiring pattern is identical for all modular units.

25. A Viterbi decoder in accordance with claim 24 and said deBruijn graph is further characterized by:
said modular units containing additional terminals for externally connectable wiring, which terminals are connected with butterfly processors inside the modular unit via a wiring pattern which is identical for all modular units.

26. A Viterbi decoder in accordance with claim 25 and said deBruijn graph is further characterized by:
said decoder containing external wiring between said additional terminals with such external wiring connecting pairs of butterfly processors in one or two of said modular units, so as to maintain deBruijn graph connectivity for the decoder.

27. A Viterbi decoder in accordance with claim 25 and further characterized by:

free butterfly processors, as well as the butterfly processors belonging to crenelated FFT structures, are mapped into unique locations in the modular hierarchy according to a one-to-one addressing formula.

28. A Viterbi decoder in accordance with claim 25 and further characterized by:
a butterfly processor's address is calculated as the bits (if any) of the butterfly's label following the first occurrence (if any) of "01" in the label, concatenated with a sequence of bits obtained by reversing the order of all of the rest of the bits of the label including the first "01" (if any).

29. A Viterbi decoder in accordance with claim 24 and said crenellated FFT structure is further characterized as:
comprising blocks of $2^b$ consecutive root butterfly processors with labels containing the prefix "01" (in binary notation), and continuing in an FFT-like connection pattern with first-generation descendants of these roots, next-generation descendants of these descendants, and so forth through the bth generation, except for punctures occurring at any point where a descendant equals a root of another modular unit.

30. A Viterbi decoder in accordance with claim 24 and further characterized by:
a first number of internal wires ("$W_{int}$") inside a modular unit containing $2^{b+2}$ butterfly processors is specified as $W_{int} = 3(2^{b+1}) - 2(b+3)$; and a second number of external pins or terminals ("$P_{ext}$") required to complete the deBruijn graph connectivity of a modular unit containing $2^{b+2}$ butterfly processors is specified as $P_{ext} = 2^{b+2} + 4(b+3)$.

31. A Viterbi decoder in accordance with claim 24 and further characterized by:
free butterfly processors, as well as the butterfly processors belonging to crenelated FFT structures, are mapped into unique locations in the modular hierarchy according to a one-to-one addressing formula.

32. A Viterbi decoder in accordance with claim 24 and further characterized by:
a butterfly processor's address is calculated as the all of the bits (if any) of the butterfly processor's label following the first occurrence (if any) of "10" in the label, concatenated with a sequence of bits obtained by reversing the order of all of the rest of the bits of the label including the first "10" (if any).

33. A Viterbi decoder in accordance with claim 13 and said deBruijn graph is further characterized by:
a crenellated FFT structure which is characterized as comprising blocks of $2^b$ consecutive root butterfly processors with labels containing the prefix "10" (in binary notation), and continuing in an FFT-like connection pattern with first-generation descendants of these roots, next-generation descendants of these descendants, and so forth through the bth generation, except for punctures occurring at any point where a descendant equals a root butterfly processor of another modular unit.

34. A method of formulating and packaging a long constraint length Viterbi decoder (K about 15 or higher) comprising the steps of:
formulating a trellis diagram of decision-making units for a constraint length K Viterbi decoder into a deBruijn graph of $2^{K-2}$ separate butterfly processors; and supplying $2^{K-1}$ connecting wires for communication of accumulated state metrics used in said decoder.

35. A method of formulating and packaging a long constraint length Viterbi decoder (K about 15 or higher) in accordance with claim 34 and comprising the additional step of:

modularizing said graph into first and second level identical modules (boards and chips), both of which can be replicated as universal building blocks.

36. A method of formulating and packaging a long constraint length Viterbi decoder (K about 15 or higher) in accordance with claim 35 and comprising the additional steps of:

fabricating said second-level modules (chips) on a VLSI microchip, said microchip containing a number of identical butterfly processors; performing arithmetical and logical operations required for decoding; and communicating as required during decoding between butterfly processors via a combination of intra-chip and extra-chip wiring.

37. A method of formulating and packaging a long constraint length Viterbi decoder (K about 15 or higher) in accordance with claim 36 and further comprising the additional step of:

fabricating the first-level modules (boards) on a circuit board, said circuit board containing a number of identical second-level modules (chips), which communicate with other chips via a combination of intra-board and extra-board wiring.

38. A method of formulating and packaging a long constraint length Viterbi decoder in accordance with claim 37 and comprising the additional step of:

specifying the intra-chip wiring, the extra-chip wiring, the intra-board wiring, and the extra-board wiring in such a manner that the intra-chip wiring pattern is identical for all chips, the intra-board wiring pattern is identical for all boards, and the combination of all of the wiring for the entire decoder exactly matches the prescribed connectivity of said deBruijn graph.

39. A method of formulating and packaging a long constraint length Viterbi decoder in accordance with claim 38, each of whose board modules further comprises:

a set of $2^B$ ($B \leq b$, where B and b are any positive integers) root butterfly processors whose labels are consecutive in the last B bits (i.e., the last B bits take on all possible values and all other bits are the same), said root butterfly processors including all of the rot butterfly processors for $2^{B-b}$ different chip modules;

descendants of the board's root butterfly processors through B generations, except for punctures occurring at any point where a descendant equals a root butterfly processor of another board;

said root butterfly processors and descendants connected to each other inside the board's VLSI chips through b generations, and outside the chips but within the integrated circuit board for the remaining B-b generations, via a crenellated FFT pattern; and additional free butterfly processors equal in number to the difference between the total number of butterfly processors in the unpunctured full-FFT pattern through B generations of descendants and the total number of root butterfly processors and descendants through B generations in the crenellated FFT pattern, said free butterfly processors not belonging to any board's crenellated FFT pattern.

40. A method of formulating and packaging a long constraint length Viterbi decoder in accordance with claim 38, each of whose board modules further comprise:

a linear chain of $2^B$ ($B \leq b$, where B and b are any positive integers) butterfly processors constructed from consecutive linear segment of butterfly processors along the same Hamiltonian path used to define the chips;

said linear chain including all of the butterfly processors in $2^{B-b}$ consecutive chip modules;

each butterfly processor within said chain of butterfly processors connected inside the board's VLSI chips to its adjacent butterfly processor or adjacent pair of butterfly processors located within the same chip; and wiring outside the chips but inside the integrated circuit board connecting each pair of adjacent butterfly processors within said chain which are not located within the same chip.

41. A method of formulating and packaging a long constraint length Viterbi decoder in accordance with claim 36, each of whose chip modules further comprises:

a set of $2^b$ root butterfly processors whose labels are consecutive in the last b bits (i.e., the last b bits take on all possible values and all other bits are the same) and descendants through b generations, except for punctures occurring at any point where a descendant equals a root butterfly processor of another chip;

said root butterfly processor and descendants connected to each other within the VLSI chip, via a punctured FFT-type connection pattern, referred to as a "crenellated FFT" pattern; and additional free butterfly processors equal in number to the difference between the total number of butterfly processors in the unpunctured full-FFT pattern through b generations of descendants and the total number of root butterfly processors and descendants through b generations in the crenellated FFT pattern, said free butterfly processors not belonging to any chip's crenellated FFT pattern.

42. A method of formulating and packaging a long-constraint length Viterbi decoder in accordance with claim 36, each of whose chip modules further comprises:

a linear chain of $2^b$ butterfly processors, constructed from consecutive linear segments of butterfly processors along any well-known Hamiltonian path of the deBruijn graph; and each butterfly processor within said chain of butterflies connected within the VLSI chip to its adjacent butterfly processor or adjacent pair of butterfly processors located within the same chip.

43. A long constraint length Viterbi decoder (K about 15 or higher) comprising:

a trellis diagram of decision-making units for a constraint length K Viterbi decoder in the form of a deBruijn graph of $2^{k-2}$ separate butterfly processors; and $2^{K-1}$ connecting wires for communication of accumulated state metrics used in said decoder.

44. A long constraint length Viterbi decoder (K about 15 or higher) in accordance with claim 43 and said graph further comprising:

first and second level identical modules (boards and chips), both of which can be replicated as universal building blocks.

45. A long constraint length Viterbi decoder (K about 15 or higher) in accordance with claim 44 and further comprising;

second-level modules (chips) fabricated on a VLSI microchip containing a number of identical butterfly processors.

46. A long constraint length Viterbi decoder (K about 15 or higher) in accordance with claim 44 and said circuit board further comprising:

a number of identical second-level modules (chips), which communicate with other chips via a combination of intra-board and extra-board wiring.

47. A long constraint length Viterbi decoder in accordance with claim 46 and having intra-chip, extra-chip, intra-board, and extra-board wiring, and further comprising:

intra-chip wiring which is identical for all chips;
intra-board wiring which is identical for all boards; and
the combination of all of the wiring for the entire decoder exactly matches the prescribed connectivity of said deBruijn graph.

* * * * *